United States Patent
Le Blevennec et al.

(10) Patent No.: US 11,482,652 B2
(45) Date of Patent: Oct. 25, 2022

(54) METHOD FOR PRODUCING AN EXTRACTION-LAYER LIGHT-EMITTING DIODE COMPRISING A STEP OF DIMENSIONING A SEMICONDUCTOR LAYER

(71) Applicant: COMMISSARIAT A L'ENERGIE ATOMIQUE ET AUX ENERGIES ALTERNATIVES, Paris (FR)

(72) Inventors: Gilles Le Blevennec, Grenoble (FR); Badhise Ben Bakir, Grenoble (FR); Eirini Sarelli, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 122 days.

(21) Appl. No.: 17/130,225

(22) Filed: Dec. 22, 2020

(65) Prior Publication Data

US 2021/0193888 A1   Jun. 24, 2021

(30) Foreign Application Priority Data

Dec. 23, 2019 (FR) ..................... 19 15503

(51) Int. Cl.
  *H01L 21/00*   (2006.01)
  *H01L 33/58*   (2010.01)
  *H01L 33/00*   (2010.01)
  (Continued)

(52) U.S. Cl.
  CPC .......... *H01L 33/58* (2013.01); *H01L 33/0075* (2013.01); *H01L 33/06* (2013.01);
  (Continued)

(58) Field of Classification Search
  CPC ..... H01L 33/0075; H01L 33/58; H01L 33/06; H01L 33/405; H01L 51/5218;
  (Continued)

(56) References Cited

U.S. PATENT DOCUMENTS

2007/0257269 A1   11/2007   Cho et al.
2010/0090234 A1   4/2010    Cho et al.
(Continued)

FOREIGN PATENT DOCUMENTS

EP   1 855 327 A2   11/2007
EP   2 362 448 A1   8/2011

OTHER PUBLICATIONS

French Preliminary Search Report dated Sep. 7, 2020 in French Application 19 15503 filed on Dec. 23, 2019 (with English Translation of Categories of Cited Documents & Written Opinion), 9 pages.

*Primary Examiner* — Samuel A Gebremariam (74) *Attorney, Agent, or Firm* — Oblon, McClelland, Maier & Neustadt, L.L.P.

(57) ABSTRACT

The invention relates to a method for producing a light-emitting diode comprising a semiconductor stack formed of a first layer 11, of an active layer 13, and of an extraction layer 6. It comprises a step of determining a distance $h_{1s}$ between emitting dipoles $\mu_1$ that are located in the active layer 13 and the extraction layer 6, such that the emitting dipoles $\mu_1$ of vertical orientation have in particular a lifetime longer than that of the emitting dipoles of horizontal orientation.

12 Claims, 5 Drawing Sheets

(51) Int. Cl.
*H01L 33/06* (2010.01)
*H01L 33/40* (2010.01)
*H01L 51/52* (2006.01)
*H01L 51/56* (2006.01)
*G02B 5/00* (2006.01)

(52) U.S. Cl.
CPC ........ *H01L 33/405* (2013.01); *H01L 51/5218* (2013.01); *H01L 51/5262* (2013.01); *H01L 51/56* (2013.01); *G02B 5/008* (2013.01); *H01L 2251/5369* (2013.01); *H01L 2933/0016* (2013.01); *H01L 2933/0058* (2013.01); *H01L 2933/0083* (2013.01)

(58) Field of Classification Search
CPC ............... H01L 51/5262; H01L 51/56; H01L 2251/5369; H01L 2933/0016; H01L 2933/0058; H01L 2933/0083; G02B 5/008

See application file for complete search history.

(56) References Cited

U.S. PATENT DOCUMENTS

| | | |
|---|---|---|
| 2010/0090242 A1 | 4/2010 | Cho et al. |
| 2010/0090243 A1 | 4/2010 | Cho et al. |
| 2010/0093123 A1 | 4/2010 | Cho et al. |
| 2011/0198642 A1 | 8/2011 | Kim |
| 2011/0297993 A1 | 12/2011 | Cho et al. |
| 2012/0153254 A1 | 6/2012 | Mastro |
| 2013/0001625 A1 | 1/2013 | Cho et al. |
| 2014/0008676 A1 | 1/2014 | Wang et al. |
| 2014/0103291 A1 | 4/2014 | Mastro |
| 2014/0124814 A1 | 5/2014 | Cho et al. |
| 2015/0263252 A1 | 9/2015 | Wang et al. |
| 2016/0111598 A1 | 4/2016 | Cho et al. |

METHOD FOR PRODUCING AN EXTRACTION-LAYER LIGHT-EMITTING DIODE COMPRISING A STEP OF DIMENSIONING A SEMICONDUCTOR LAYER

TECHNICAL FIELD

The field of the invention is that of methods for producing light-emitting diodes comprising a semiconductor stack of inorganic or organic layers, including an emissive active layer and an extraction layer.

PRIOR ART

Figure 1A:
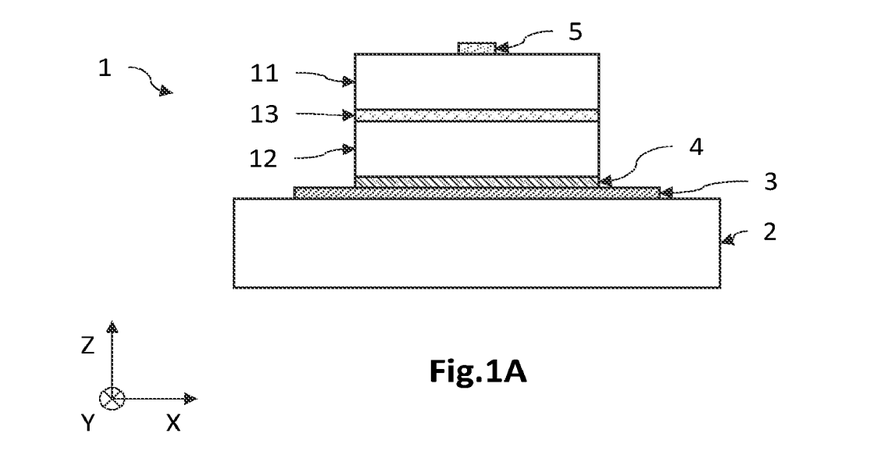
FIG. 1A, described above, is a schematic and partial cross-sectional view of a light-emitting diode according to one example of the prior art.

FIG. 1A partially and schematically illustrates one example of a light-emitting diode 1 comprising a stack of semiconductor layers, here inorganic, including a first, N-doped layer 11, a second, P-doped layer 12, and an active layer 13 arranged between the two doped layers 11, 12 and where most of the luminous radiation is emitted.

The light-emitting diode 1 rests here on a substrate 2 comprising a conductive layer 3, in contact with which is an advantageously reflective electrode 4 forming the anode. A preferably transparent electrode 5 forming a cathode rests on the N-doped layer 11. The reflective electrode 4 is preferably made of a metal material.

The active layer 13 may be formed, in the case of a PN junction, by the interface of the two doped layers 11, 12 in contact with one another, or in the case of a PIN junction, by at least one intrinsic layer 13 (i.e. a layer that is not intentionally doped) that may comprise one or more quantum wells. Each quantum well may be formed by a layer having a bandgap energy lower than that of the two barrier layers between which it is located, or may be formed by quantum dots.

The charge carriers (electrons and holes) are introduced into the semiconductor stack by the electrodes 4, 5, then diffuse to the active layer 13 where they recombine radiatively. The luminous radiation associated with the radiative recombination of the electron-hole pairs in the active layer 13 corresponds to the electric dipole radiation emitted by what is referred to as an "emitting" dipole which oscillates harmonically along the axis of its dipole moment $\mu$ (also called TDMV, for transition dipole moment vector).

Figure 1B:
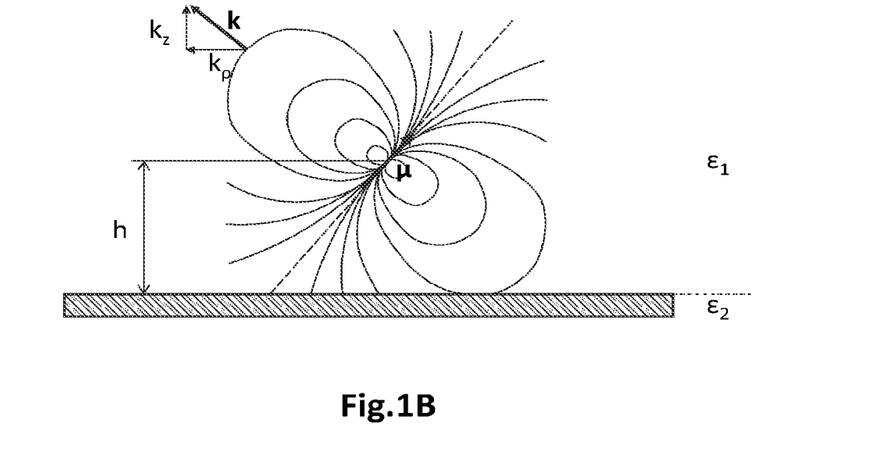
FIG. 1B, described above, schematically illustrates an emitting dipole μ in a first uniform medium and located at a distance h from a second uniform medium, emitting a luminous radiation corresponding to a radiative recombination of an electron-hole pair.

FIG. 1B schematically illustrates an emitting dipole located in a first optically linear, uniform and isotropic medium (containing the active layer), of dielectric constant $\varepsilon_1$ and spaced apart from a second optically linear, uniform and isotropic medium of dielectric constant $\varepsilon_2$. It exhibits here an orientation inclined by an angle $\theta$ with respect to the axis Z orthogonal to the plan XY of the active layer. The field lines extend axisymmetrically about the axis of the dipole moment $\mu$. The wave vector k is orthogonal to the tangent at any point on a field line. As indicated in the article by Schmidt et al entitled *Emitter Orientation as a Key Parameter in Organic Light-Emitting Diodes*, Phys. Rev. Applied 8, 037001 (2017), the orientation of the emitting dipoles is a parameter that may affect the luminous efficacy of an emissive diode such as an organic light-emitting diode.

There is thus a need for a method for producing at least one light-emitting diode whose luminous efficacy is improved.

DISCLOSURE OF THE INVENTION

The objective of the invention is to overcome, at least in part, the drawbacks of the prior art, and more particularly to propose a method for producing at least one light-emitting diode exhibiting improved luminous efficacy.

To that end, the subject of the invention is a method for producing at least one light-emitting diode comprising: a semiconductor stack formed of a first semiconductor layer, of a second semiconductor layer, and of an active layer located between the two semiconductor layers; and an extraction layer, made of a transparent dielectric material comprising nanoscale particles, extending in contact with the first semiconductor layer. The method comprises the following steps:

choosing the materials of the first semiconductor layer and of the active layer, and of the extraction layer;

determining a first non-zero distance between, on the one hand, what are referred to as "emitting" dipoles associated with the radiative recombination of electron-hole pairs in the active layer and, on the other hand, the extraction layer, for which:

a lifetime of the emitting dipoles, having what is referred to as a "vertical" orientation along an axis orthogonal to the plane of the active layer, is longer than the lifetime of the emitting dipoles having what is referred to as a "horizontal" orientation along an axis parallel to the plane of the active layer, on the basis of a predetermined function expressing a change in a parameter representative of the lifetime of an emitting dipole having a predefined orientation according to its distance from the extraction layer, taking into account optical properties of said materials chosen;

optical dipoles associated with the nanoscale particles are located in the near field of the emitting dipoles, so as to allow non-radiative coupling of dipole-dipole type between the emitting dipoles and the optical dipoles;

producing the light-emitting diode, a thickness of the first semiconductor layer being such that the emitting dipoles are located at the first determined distance with respect to the extraction layer, the emitting dipoles then being oriented orthogonally to the plane of the active layer.

Some preferred but non-limiting aspects of this method are the following.

The nanoscale particles may be quantum dots made of semiconductor nanocrystals, and/or be made of at least one metal material.

The nanoscale particles may have a mean diameter of between 0.2 nm and 500 nm.

The nanoscale particles may extend in a plane parallel to the active layer, and be arranged at the interface with the first semiconductor layer.

The first determined distance may be smaller than or equal to 50 nm, thus optimizing the non-radiative coupling of dipole-dipole type between the emitting dipoles and the optical dipoles.

The first determined distance may be defined along an axis orthogonal to the plane of the active layer, from an interface between the extraction layer and the first semiconductor layer to a plane passing through halfway through a thickness of the active layer.

The active layer may comprise at least one quantum well emissive layer, and a barrier layer located between the first semiconductor layer and the emissive layer, the determined distance being defined along an axis orthogonal to the plane of the active layer, between, on the one hand, the interface between the extraction layer and the first semiconductor layer, and, on the other hand, a plane passing through halfway through the thickness of the emissive layer.

The method may comprise a step of determining a second non-zero distance between the optical dipoles associated with the nanoscale particles and a surrounding medium extending in contact with an upper face of the extraction layer opposite the first semiconductor layer, comprising the following sub-steps:

choosing an orientation of the optical dipoles with respect to a plane of the extraction layer, from among: a horizontal orientation for which the optical dipoles are oriented so as to be parallel to the plane of the extraction layer, and a vertical orientation for which the optical dipoles are oriented so as to be orthogonal to the plane of the extraction layer;

determining the second distance between the optical dipoles and the surrounding medium, for which a lifetime of the optical dipoles having the chosen orientation is longer than that of the optical dipoles having the non-chosen orientation, on the basis of a predetermined function expressing a change in a parameter representative of the lifetime of an optical dipole having a predefined orientation according to its distance from the surrounding medium, taking into account the optical properties of the extraction layer and of the surrounding medium;

producing the light-emitting diode, a thickness of the dielectric material of the extraction layer being such that the optical dipoles are located at the second determined distance with respect to the surrounding medium, the optical dipoles then being oriented according to the chosen orientation with respect to the plane of the extraction layer.

The step of determining the second distance may comprise the following sub-steps:

determining, over a predefined distance range, the change according to distance in the parameter representative of the lifetime of the optical dipole having the chosen orientation, and the change according to distance in the parameter representative of the lifetime of the optical dipole having the non-chosen orientation;

determining what is referred to as a "difference" parameter representative of a difference in the parameter representative of the lifetime of the optical dipole having the chosen orientation with respect to the parameter representative of the lifetime of the optical dipole having the non-chosen orientation, over said predefined distance range;

determining a non-zero distance such that:
    the parameter representative of the lifetime of the optical dipole having the chosen orientation is greater, for the determined distance, than that of the parameter representative of the lifetime of the optical dipole having the non-chosen orientation, and that
    the difference parameter has, for the determined distance, a maximum value over at least a portion of the distance range.

The method may comprise:

a step of determining a third non-zero distance between the emitting dipoles and a reflective electrode extending in contact with the second semiconductor layer, for which a lifetime of the emitting dipoles having the vertical orientation is longer than that of the emitting dipoles having the horizontal orientation, on the basis of a predetermined function expressing a change in a parameter representative of the lifetime of an emitting dipole having a predefined orientation according to its distance from the reflective electrode, taking into account the optical properties of the active layer and of the second semiconductor layer, and of the reflective electrode;

producing the light-emitting diode, a thickness of the second semiconductor layer being such that the emitting dipoles are located at the third determined distance with respect to the reflective electrode, the emitting dipoles then being oriented orthogonally to the plane of the active layer.

The reflective electrode may be an anode capable of injecting holes into the semiconductor stack, and the second semiconductor layer may be made of a P-doped semiconductor crystalline material, or be made of a hole-conducting organic semiconductor material.

The first semiconductor layer may be made of an N-doped semiconductor crystalline material, or be made of an electron-conducting organic semiconductor material.

BRIEF DESCRIPTION OF THE DRAWINGS

Other aspects, aims, advantages and features of the invention will become more clearly apparent from the following detailed description of preferred embodiments thereof, which description is given by way of non-limiting example and with reference to the appended drawings, in which.

DETAILED DISCLOSURE OF PARTICULAR EMBODIMENTS

In the figures and in the remainder of the description, the same references have been used to designate identical or similar elements. In addition, the various elements are not shown to scale for the sake of clarity of the figures. Moreover, the various embodiments and variants are not mutually exclusive and may be combined with one another. Unless indicated otherwise, the terms "substantially", "about" and "of the order of" mean to within 10%, and preferably to within 5%. Moreover, the terms "comprised between . . . and . . . " and equivalents mean that the bounds are included, unless indicated otherwise.

The invention relates to a method for producing at least one light-emitting diode exhibiting improved luminous efficacy. The luminous efficacy is defined here as the ratio of the luminous flux emitted by the light-emitting diode to the electrical power injected, and corresponds to the external quantum efficiency (EQE). It is equal to the product of the internal quantum efficiency (IQE) and of the light extraction efficiency. The internal quantum efficiency is the ratio of the number of photons generated by radiative recombination to the number of electrons injected by the cathode, and the light extraction efficiency is the ratio of the number of photons emitted out of the diode to the number of photons generated.

For that, a first layer of the semiconductor stack of the light-emitting diode is coated at least partly with an extraction layer notably intended to increase the light extraction efficiency. This extraction layer is formed of at least one dielectric material that is transparent to the luminous radiation emitted by the active layer of the light-emitting diode. It also comprises, located in the dielectric material, nanoscale particles such as quantum dots and/or metal particles, such that the light extraction induces a near-field coupling of dipole-dipole type between the optical dipoles referred to as "donors" associated with the active layer and the optical dipoles referred to as "acceptors" associated with the nanoscale particles.

Additionally, as explained in detail below, the first semiconductor layer is dimensioned such that the donor optical dipoles associated with the radiative recombination of the electron-hole pairs in the active layer have a vertical orientation that predominates over a horizontal orientation. The horizontal or vertical character of the orientation of the optical dipole is in relation to a plane along which the active layer of the light-emitting diode extends. In addition, the orientation of an emitting dipole corresponds to the angle of inclination θ formed by the dipole moment μ of the optical dipole with respect to an axis orthogonal to the plane of the active layer.

Figure 2A:
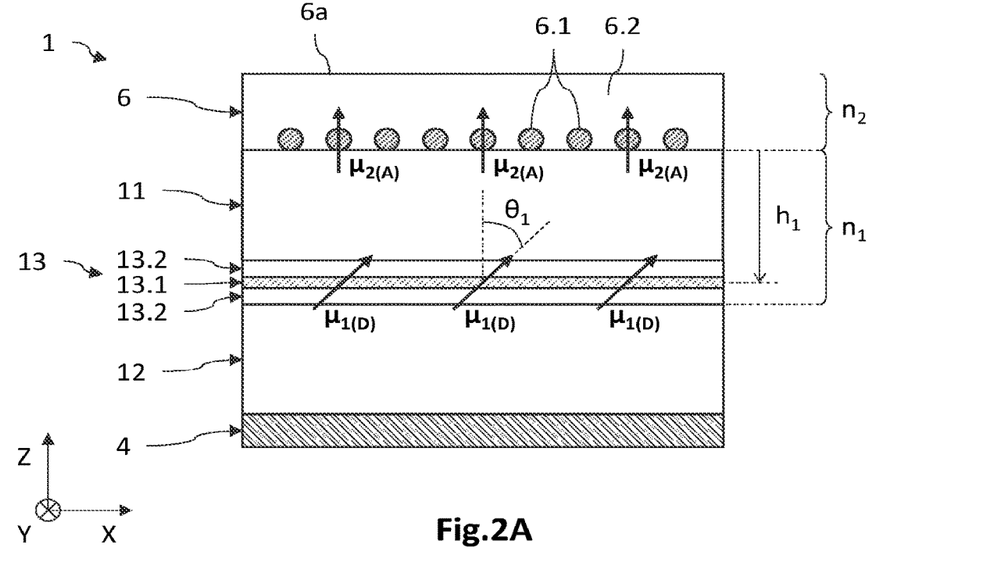
FIG. 2A is a schematic and partial cross-sectional view of a light-emitting diode comprising an extraction layer, obtained according to a production method according to one embodiment, illustrating emitting dipoles $\mu_1$ referred to as "donors" that are located in an active layer and are arranged at a distance $h_1$ from the extraction layer, and optical dipoles $\mu_2$ referred to as "acceptors" that are located in the extraction layer.

FIG. 2A is a schematic and partial cross-sectional view of an example of a light-emitting diode 1. This light-emitting diode 1 is similar to that described above, and differs therefrom essentially in that it comprises an extraction layer 6 and has been obtained by means of a production method according to one embodiment.

An orthogonal direct coordinate system XYZ, in which the axes X and Y form a plane parallel to the main plane of a substrate (not shown) on which the light-emitting diode 1 rests, and in which the axis Z is oriented orthogonally to the plane XY and in the direction of the extraction layer 6, is defined here and will be referred to in the rest of the description. Here, the active layer 13 extends along the plane XY.

The light-emitting diode 1 thus comprises a semiconductor stack formed of a first layer 11, of an active layer 13, and of a second layer 12. In this example, the semiconductor stack is produced on the basis of an inorganic crystalline semiconductor material, but, as a variant, it may be produced on the basis of an organic semiconductor material (OLED). The light-emitting diode 1 may comprise additional layers which are not shown, for example an electron-blocking layer, a buffer layer for matching the lattice parameter, etc.

What is meant by "produced on the basis of semiconductor material" is that the semiconductor stack is made of this semiconductor material or of one or more compounds comprising this semiconductor material. By way of example, the semiconductor stack is produced on the basis of a III-V compound, for example on the basis of GaN, and may thus comprise at least one semiconductor layer made of doped or undoped GaN, and at least one semiconductor layer made of a compound comprising GaN, for example of InGaN, AlGaN, InAlGaN, or is even produced on the basis of InP, for example of the type AlInGaP, etc.

It is noted, as indicated above, that the light-emitting diode 1 may be an organic diode, in which case it is formed of two, anode and cathode, electrodes between which organic semiconductor layers are stacked, including an electron transport layer (ETL), an active layer (EML) and a hole transport layer (HTL).

In this example where the light-emitting diode 1 is produced on the basis of an inorganic material, the semiconductor stack is produced on the basis of GaN, the first layer 11 is made of N-doped GaN, the second layer 12 is made of P-doped GaN. The active layer 13 comprises here a quantum well layer 13.1 made of intrinsic InGaN located between two barrier layers 13.2 made of intrinsic GaN. Of course, the active layer 13 may comprise a plurality of quantum well layers located between two barrier layers. The reflective electrode 4 is made of one or more metal materials chosen from among silver, aluminum, copper, titanium, gold, nickel, iridium, tungsten, indium, inter alia. It extends in contact with the second layer 12. It is referred to as reflective insofar as its reflection coefficient is at least equal to 75%, at least equal to 85%, or even to 95%, or even more, at the emission wavelength of the light-emitting diode 1. The active layer 13 extends along a plane XY parallel to that of the extraction layer 6. A cathode electrode (not shown) may extend in contact with the first layer 11, for example coplanar with the extraction layer 6.

The extraction layer 6 is suitable for allowing a near-field non-radiative coupling of dipole-dipole type with the active layer 13, thus improving the light extraction efficiency and therefore the performances of the light-emitting diode 1. It extends in contact with the first layer 11 (here made of N-doped GaN) and at least partially coats it (notably when another portion of the surface of the first layer 11 is coated with the cathode electrode).

The extraction layer 6 is formed of a dielectric material 6.2 that is transparent to the emission wavelength of the active layer 13 which forms a binding matrix in which nanoscale particles 6.1 are located. The transparent dielectric material 6.2 has a coefficient of transmission of the incident radiation that is at least equal to 50%, preferably at least equal to 75%, or even to 90%, or even more. It may be chosen from among silicone, polysiloxane, PDMS, PMMA, PVA, oxide-based mineral layers of sol-gel type such as $SiO_2$, $Al_2O_3$, ZnO, $TiO_2$, inter alia.

The nanoscale particles 6.1 have an average diameter of the order of a few nanometers to a few hundreds of nanometers, for example are between 0.2 nm and 500 nm, and preferably between 2 nm and 150 nm. They may notably be metal particles and/or quantum dots. The particles are elements that are distinct from one another, and may be of any shape, for example spherical, angular, flattened or elongated, or any other shape. The size of the particles is here the smallest dimension of the particles and the average diameter is the arithmetic mean of the size of the particles.

In the case where the nanoscale particles 6.1 are made of a metal material, this may be chosen from among Ag, Cu, Au, Pt, Pd, Ni, Co, Rh, In, Ru, Fe, CuNi, inter alia, and from among the compounds formed from a mixture of at least two or more of these materials. The surface density of metal particles is determined by Mie scattering so as to optimize the absorption efficiency of a metal particle according to the refractive index of the dielectric medium. By way of example, for a dielectric medium with a refractive index of 1.5, an average diameter of 55 nm for nanoscale particles of silver makes it possible to optimize the absorption efficiency at 460 nm. The absorption cross section of these particles is then $0.5 \times 10^{-14}$ $m^2$ and the surface density may then be of the order of $2 \times 10^{14}$ $m^{-2}$.

In the case where the nanoscale particles 6.1 are quantum dots, they may be produced in the form of semiconductor nanocrystals, the average size of which may be between 0.2 nm and 500 nm, for example between 1 nm and 100 nm, and notably between 2 nm and 30 nm. The semiconductor material of the nanocrystals may notably be chosen from among cadmium selenide (CdSe), indium phosphide (InP), cadmium sulfide (CdS), zinc sulfide (ZnS), cadmium oxide (CdO), cadmium zinc selenide (CdZnSe), or from among other potentially suitable semiconductor materials. The surface density is here notably dependent on the desired light conversion efficiency, i.e. on the ratio of the intensity of the photoluminescence radiation emitted by the quantum dots 6.1 to the intensity of the electroluminescence radiation emitted by the active layer 13.

The nanoscale particles 6.1 may also be plasmon-effect quantum dots, produced for example from a metal core surrounded by a dielectric sheath, itself surrounded by a layer forming a quantum dot. The metal core, for example made of silver, forms an absorbent antenna for the dipole-dipole coupling, and couples this absorbed energy with the material forming the quantum dot, which will subsequently emit a photoluminescence radiation.

The nanoscale particles 6.1 are arranged in the extraction layer 6 preferably in proximity to or at the interface with the first layer 11, so as to allow the near-field non-radiative coupling between the optical dipoles $\mu_1$ associated with the active layer 13 and the optical dipoles $\mu_2$ associated with the nanoscale particles 6.1. They are preferably arranged along a plane parallel to the plane XY. Preferably, the distance along the axis Z separating the nanoscale particles 6.1 from the active layer 13 is smaller than or equal to 50 nm. This distance may be defined between the plane in which the nanoscale particles 6.1 mainly extend and a plane passing through halfway through the thickness of the active layer 13.

Since the active layer 13 is the main location of the radiative recombination of the electron-hole pairs, the optical dipoles $\mu_1$ referred to as emitters (also called donors $\mu_{1(D)}$ in the context of dipole-dipole coupling) are located in the active layer 13, and are therefore spaced by a distance $h_1$ with respect to the extraction layer 6. It is considered that they are located in a plane parallel to the plane XY and spaced by the distance $h_1$ from the extraction layer 6. Let $h_1=0$ denote the interface between the extraction layer 6 and the first layer 11.

The distance $h_1$ separating the emitting dipoles $\mu_1$ with respect to the extraction layer 6 is defined for the rest of the description as being the distance along the axis Z between, on the one hand, a plane passing through halfway through the thickness of the active layer 13, and, on the other hand, the extraction layer 6. However, as a variant, and notably when the active layer 13 comprises a plurality of quantum well emissive layers 13.1, the distance $h_1$ may be defined as being the distance along the axis Z between, on the one hand, a plane passing through halfway through the thickness of the quantum well layer 13.1 located as close as possible to the layer 12 made of P—GaN, and, on the other hand, the extraction layer 6. A prior study may be carried out in order to determine where exactly in the active layer 13 most of the radiative recombination of the electron-hole pairs is located. In this example, the distance $h_1$ is therefore equal to the sum of the thickness of the first layer 11, of the thickness of the barrier layer 13.2, and of halfway through the thickness of the emissive layer 13.1.

The orientation of an emitting dipole $\mu_1$ corresponds to the angle $\theta_1$ between its dipole moment and the axis Z orthogonal to the plane XY of the active layer 13. Thus, an angle $\theta_1$ equal to 0° corresponds to a vertical orientation of the emitting dipoles $\mu_1$ with respect to the plane of the active layer 13 and here in the direction of the extraction layer 6, and an angle $\theta_1$ equal to 90° corresponds to a horizontal orientation.

It is considered here that the emitting dipoles $\mu_1$ are located in a first optically linear, uniform and isotropic medium of dielectric constant $\varepsilon_1$ (relative permittivity) and of refractive index $n_1$, this first medium being formed of the active layer 13 and of the first layer 11. What is meant by optically uniform is that the dielectric constant $\varepsilon_1$ is substantially constant at any point in this first medium, to within 10%, or even to within 5%, or even less.

The dielectric material 6.2 of the extraction layer 6 forms a second medium that is considered, to a first approximation, as being optically linear, uniform and isotropic, of dielectric constant $\varepsilon_2$ and of refractive index $n_2$. By extension, it is considered that the extraction layer 6 forms this same second uniform medium. The refractive index may be the optical index having a real part (refractive index per se) and a non-zero imaginary part (extinction index).

The method for producing a light-emitting diode 1 comprises a phase of determining a distance denoted by $h_{1s}$ between the emitting dipoles $\mu_1$ associated with the radiative recombination in the active layer 13 and the extraction layer 6, such that the emitting dipoles $\mu_1$ have a vertical orientation ($\theta_1=0°$). The thickness of the first layer 11 may then be determined by taking the value $h_{1s}$ into account.

For that, a function g is predetermined which expresses a change, according to the distance $h_1$, in a parameter representative of a lifetime of an emitting dipole $\mu_1$ having one or the other of said orientations, according to the optical properties $n_1$, $n_2$ of the first and second uniform media. Thus, the function g is denoted by $g_h$ or $g_v$ when it is in relation to a horizontal ($\theta_1=90°$) or vertical ($\theta_1=0°$) orientation.

The lifetime $\tau$ is defined as being that of an emitting dipole located in an optically linear, uniform and isotropic medium, of dielectric constant $\varepsilon$. It corresponds to the lifetime of the spontaneous emission of a two-level system, for which it is considered, to a first approximation, that it is identical to the lifetime of the emitting dipoles in the context of electroluminescence. Let $\tau_n$ denote the normalized lifetime equal to the ratio of the lifetime $\tau/\tau_0$, where the lifetime $\tau_0$ is defined as being that of an emitting dipole located in the same medium but of infinite dimensions, hence at an infinite distance from the second uniform medium.

Now, the normalized lifetime $\tau_n$ is equal to the inverse of the normalized radiated power $P/P_0$ of the emitting dipole, in other words: $\tau_n=\tau/\tau_0=P_0/P$. Here, P is the energy dissipation rate of the emitting dipole, in other words the optical power radiated by the emitting dipole in the first uniform medium and located at a distance h from the second uniform medium, and $P_0$ is the optical power radiated by the same emitting dipole in the first uniform medium of infinite dimensions (far from the second uniform medium, for example more than 500 nm away from the second uniform medium).

The work by Novotny & Hecht entitled *Principles of Nano-Optics*, Cambridge University Press, 2006, indicates on page 344 (equation no.10.26) an expression for the normalized radiated optical power $P/P_0$ of an emitting dipole located in a first uniform medium at a distance h from a substrate formed of a second uniform medium (thin layer) and of a third uniform medium.

This equation may be adapted for the present configuration of a light-emitting diode 1 where the emitting dipole of the active layer 13 is located in the first uniform medium formed of the active layer 13 and of the first layer 11, and is arranged at a distance h from the second uniform medium formed of the extraction layer 6. Thus, the normalized optical power radiated by such an emitting dipole may be written as:

$$\frac{P}{P_0} = 1 + \frac{3}{4}\frac{\mu_x^2+\mu_y^2}{\mu^2}\int_0^\infty \text{Re}\left(\frac{s}{s_z}[r^s - s_z^2 r^p]e^{2ik_1 hs_z}\right)ds + \frac{3}{2}\frac{\mu_z^2}{\mu^2}\int_0^\infty \text{Re}\left(\frac{s^3}{s_z}r^p e^{2ik_1 hs_z}\right)ds$$

where:
- $\mu$ is the norm of the dipole moment, and $\mu_{x,y,z}$ is the Cartesian coordinate of the dipole moment along the axis x, y or z;
- s is the variable of integration defined by $s=k_\rho/k_1$, with: $k_\rho$ the projection of the wave vector k in the plane XY, such that $k_\rho=k_x/\cos\phi$ and $k_\rho=k_y/\sin\phi$; and $k_1$ is the norm of the wave vector k in the medium 1;
- $s_z$ equal to $(1-s^2)^{1/2}$;
- $r^s$ and $r^p$ are the reflection coefficients of the optical radiation emitted by the emitting dipole for the s and p polarizations at the interface between the first layer 11 and the extraction layer 6. These coefficients are dependent on the variable of integration s and their general expressions are given by equations 10.20 and 10.21 on p. 342 of Novotny & Hecht 2006.

However, in the configuration according to the invention, the reflection coefficient $r^p$ at the interface with the extraction layer 6 for the luminous radiation of p polarization may be written, according to the variable of integration s, in the following manner:

$$r^p = \frac{\tan\left[\tan^{-1}\left(\frac{s}{s_z}\right) - \sin^{-1}\left(\frac{n_1}{n_2}\sin\left(\tan^{-1}\left(\frac{s}{s_z}\right)\right)\right)\right]}{\tan\left[\tan^{-1}\left(\frac{s}{s_z}\right) + \sin^{-1}\left(\frac{n_1}{n_2}\sin\left(\tan^{-1}\left(\frac{s}{s_z}\right)\right)\right)\right]}$$

Furthermore, the reflection coefficient $r^s$ at the interface with the extraction layer 6 for the luminous radiation of s polarization may be written, according to the variable of integration s, in the following manner:

$$r^s = -\frac{\sin\left[\tan^{-1}\left(\frac{s}{s_z}\right) - \sin^{-1}\left(\frac{n_1}{n_2}\sin\left(\tan^{-1}\left(\frac{s}{s_z}\right)\right)\right)\right]}{\sin\left[\tan^{-1}\left(\frac{s}{s_z}\right) + \sin^{-1}\left(\frac{n_1}{n_2}\sin\left(\tan^{-1}\left(\frac{s}{s_z}\right)\right)\right)\right]}$$

Additionally, the term $\mu z^2/\mu^2$ corresponds to $\cos\theta$, and the term $(\mu_x^2+\mu_y^2)/\mu^2$ is equal to $\sin\theta$. The wave vector k has, in the first uniform medium, a norm denoted by $k_1$ equal to $2\pi/(n_1\times\lambda)$. As mentioned above, $n_1$ and $n_2$ are the refractive indices of the first and second uniform media, which are deduced from the dielectric constants $\varepsilon_1$, $\varepsilon_2$.

Thus, the radiated power P radiated by the emitting dipole is formed of three main terms, namely the intrinsic radiated power $P_0$ (apart from any effect related to the environment of the first uniform medium), a term corresponding to the radiated power associated with the dipole moment $\mu_x$ and $\mu_y$ in the plane XY and a term corresponding to the radiated power associated with the dipole moment $\mu_z$ along the axis Z.

This equation is obtained on the basis of Maxwell's equations, using dyadic Green's functions to describe a single oscillating point dipole, and the angular spectrum method for the field of the dipole extends the Green's functions to plane and evanescent waves, respectively, in a cylindrical system. The emitting dipole therefore interacts with its own reflected plane and evanescent waves.

Thus, a function g is obtained that expresses the change in a parameter representative of the lifetime of an emitting dipole $\mu_1$ of predefined orientation $\theta_1$ according to the distance $h_1$ from the extraction layer 6, taking into account the optical properties $n_1$ of the first uniform medium (formed of the first layer 11 and active layer 13) and of those $n_2$ of the second uniform medium (extraction layer 6). The representative parameter is preferably the normalized lifetime $\tau_n=\tau/\tau_0$.

Figure 2B:
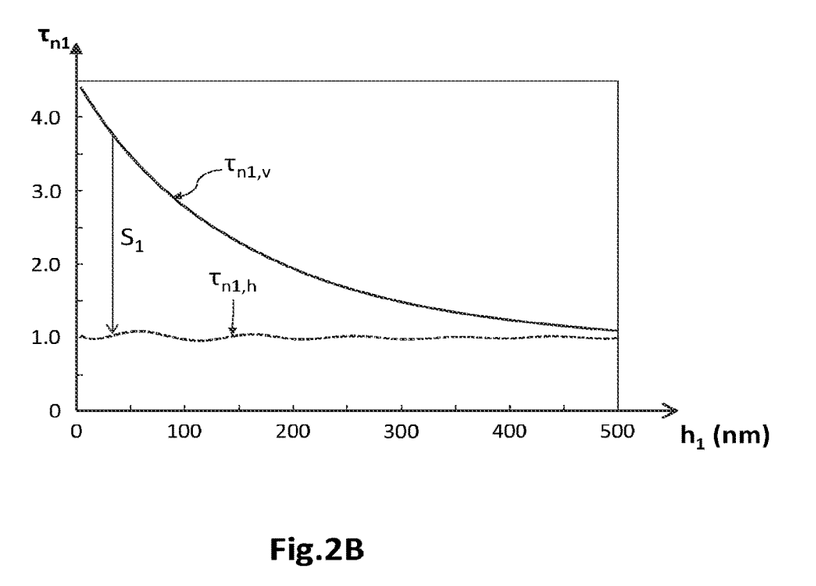
FIG. 2B illustrates an example of the change, according to the distance $h_1$, in the normalized lifetime $\tau_{n1,v}$ of an emitting dipole $\mu_1$ of vertical orientation and that $\tau_{n1,h}$ of an emitting dipole $\mu_1$ of horizontal orientation, in the case where the first uniform medium (first layer and active layer) is produced on the basis of GaN, and where the second uniform medium (extraction layer) is produced on the basis of a dielectric material, for an emission wavelength $\lambda_e$ equal to 460 nm.

FIG. 2B illustrates an example of changes, according to the distance $h_1$, in the normalized lifetime $\tau_{n1,v}$ of an emitting dipole $\mu_1$ of vertical orientation and that $\tau_{n1,h}$ of an emitting dipole $\mu_1$ of horizontal orientation, in the case where the first uniform medium is produced on the basis of GaN (first layer 11 and active layer 13), and the second uniform medium is made of the dielectric material 6.2 (extraction layer 6), for a emission wavelength equal to 460 nm. These changes are determined on the basis of the function g described above, and are given over a predefined distance range $\Delta h_{1ref}$ ranging here from 0 nm to 500 nm.

More precisely, the light-emitting diode 1 comprises an emissive layer 13.1 made of InGaN (no barrier layer made of intrinsic GaN) and a first layer 11 made of N-doped GaN which together form the first uniform medium. The refractive index $n_1$ is equal to about 2.4764 for an emission wavelength of λ=460 nm. The first layer 11 is in contact with the extraction layer 6 made of a dielectric material which forms the second uniform medium and has a refractive index $n_2$ equal here to 1.5.

It is seen that the normalized lifetime $\tau_{n1,h}$ of the emitting dipoles $\mu_1$ of horizontal orientation remains substantially constant and equal to 1.0, whatever the value of the distance $h_1$ over the range $\Delta h_{1ref}$. However, the normalized lifetime $\tau_{n1,v}$ of the emitting dipoles $\mu_1$ of vertical orientation decreases as the distance $h_1$ increases, going here from about 4.5 for $h_1$=0 nm to 1.0 around 500 nm. Thus, over the entire range $\Delta h_{1ref}$, the vertical orientation of the emitting dipoles $\mu_1$ remains predominant over the horizontal orientation. The thickness of the first layer 11 may therefore be dimensioned such that the distance $h_{1s}$ retained between the emitting dipoles from the active layer 13 to the extraction layer 6 is between about 1 nm and 500 nm.

However, it is advantageous for the distance $h_{1s}$ to be determined such that a difference between the normalized lifetime $\tau_{n1,v}$ of the emitting dipoles $\mu_1$ of vertical orientation and the normalized lifetime $\tau_{n1,h}$ of the emitting dipoles $\mu_1$ of horizontal orientation is large in terms of absolute value. Thus, it is possible to define a parameter referred to as the "difference" parameter $S_1$, called selectivity, representative of a difference between the normalized lifetime $\tau_{n1,h}$ of an emitting dipole $\mu_1$ having the vertical orientation and the normalized lifetime $\tau_{n1,h}$ of an emitting dipole $\mu_1$ having the horizontal orientation. This selectivity $S_1$ may be defined as being the difference or the ratio, in terms of absolute value or otherwise, between the normalized lifetime $\tau_{n1,v}$ of an emitting dipole $\mu_1$ having the vertical orientation and the normalized lifetime $\tau_{n1,h}$ of an emitting dipole $\mu_1$ having the horizontal orientation. In other words, $S_1=\tau_{n1,v}-\tau_{n1,h}$ or, as a variant, $S_1=\tau_{n1,v}/\tau_{n1,h}$. Hereinafter, $S_1=\tau_{n1,v}-\tau_{n1,h}$ is used.

It is seen that the parameter $S_1$ has a value that is higher than or equal to 2.0 for $h_1$ shorter than or equal to 100 nm, and a value that is higher than or equal to 2.5 for $h_1$ shorter than or equal to about 50 nm. The thickness of the first layer 11 may therefore be dimensioned such that the distance $h_{1s}$ between the emitting dipoles from the active layer 13 to the extraction layer 6 is between about 1 nm and 50 nm. Preferably, the thickness of the first layer 11 could be chosen between 1 nm and 100 nm, and preferably between about 5 nm and 10 nm so as to maximize the near-field effect. What is meant by "near field" is that the distance between the acceptor and donor dipoles is shorter than or equal to λ/5, or even shorter than or equal to λ/10, where λ is the emission wavelength of the radiation emitted by the active layer, by way of the refractive index of the medium, in which the electric field radiated by the dipole decreases by $1/r^3$.

Thus, it is possible to determine a distance $h_{1s}$ for which the normalized lifetime $\tau_{n1,v}$ associated with the vertical orientation of the emitting dipoles $\mu_1$ is longer than the normalized lifetime $\tau_{n1,h}$ associated with the horizontal orientation. In this case, the emitting dipoles $\mu_1$ having the vertical orientation will predominate over those having the horizontal orientation. The light-emitting diode 1 may then be dimensioned, in particular the thickness of the first layer 11, such that the emitting dipoles $\mu_1$ are located at the distance $h_{s1}$ from the extraction layer 6.

Thus, a near-field non-radiative coupling of dipole-dipole type is present between the emitting dipoles denoted here by $\mu_{1(D)}$ (for Donors) that are associated with the radiative recombination in the active layer 13 and the dipoles denoted here by $\mu_{2(A)}$ (for Acceptors) that are associated with the nanoscale particles 6.1. These dipoles $\mu_{1(D)}$ and $\mu_{2(A)}$ are the vectors of the dipole moments of the optical dipoles. The intensity of this non-radiative coupling is characterized by the angular coupling factor $K^2$.

In a known manner, the angular coupling factor $K^2$ between the emitting dipoles $\mu_{1(D)}$ and $\mu_{2(A)}$ is defined by the relationship:

$$K^2=(n_A \cdot n_D - 3(n_A \cdot n_D)(n_r \cdot n_A))^2$$

This expression is notably described in the work by Novotny & Hecht 2006 on page 290 (equation 8.169). The factor $K^2$ is dependent on the orientation of the unit vectors $n_A$ and $n_D$ that are associated with the acceptor $\mu_{2(A)}$ and donor $\mu_{1(D)}$ dipoles, and on the unit vector $n_r$ linking the acceptor $\mu_{2(A)}$ and donor $\mu_{1(D)}$ dipoles in question.

The dipole-dipole interaction modifies the absorption properties of the acceptor dipoles $\mu_{2(A)}$. There is a non-radiative transfer of energy between the donor dipoles $\mu_{1(D)}$ and the acceptor dipoles $\mu_{2(A)}$, called FRET (Förster resonance energy transfer) coupling, which manifests as an increase in the luminous efficacy of the light-emitting diode 1.

It is seen that the angular coupling factor $K^2$ is maximum when the donor $\mu_{1(D)}$ and acceptor $\mu_{2(A)}$ dipoles are collinear, in which case the factor $K^2$ is equal to 4. Thus, dimensioning the first layer 11 in order to obtain a predominant vertical orientation of the donor dipoles $\mu_{1(D)}$ allows the acceptor dipoles $\mu_{2(A)}$ to be made collinear with the donor dipoles $\mu_{1(D)}$, and thus the luminous efficacy of the light-emitting diode 1 to be improved further. Specifically, in the context of dipole-dipole non-radiative coupling, the acceptor dipoles $\mu_{2(A)}$ are oriented according to the orientation of the donor dipoles $\mu_{1(D)}$.

In the case where the extraction layer 6 is formed of metal particles 6.1, the luminous efficacy of the light-emitting diode 1 is further increased by an additional luminous emission by plasmonic effect. The metal particles 6.1 may thus emit a luminous radiation at a resonance wavelength that is substantially identical to the electroluminescence wavelength $\lambda_e$ of the light-emitting diode 1. For that, plasmonic modes of the metal particles 6.1 are excited, a resonant mode of which may result in the emission of the additional luminous radiation. Here, the plasmonic resonant mode of the metal particles 6.1 corresponds to acceptor dipoles $\mu_{2(A)}$ that are located in the near field of the donor dipoles $\mu_{1(D)}$. Additionally, in the case where the nanoscale particles 6.1 are quantum dots, the extraction layer 6 provides an addition color conversion function, by converting a portion of the luminous radiation emitted by the active layer 13 into a luminous radiation of longer wavelength.

Additionally, it may be advantageous to dimension the thickness of the extraction layer 6 such that the optical dipoles $\mu_2$ associated with the nanoscale particles 6.1 are located at a determined distance $h_{2s}$ with respect to the interface between its upper face 6a and the surrounding medium (e.g. the air). Specifically, it may be advantageous to make the vertical orientation of these optical dipoles $\mu_2$ predominate so as for example to further optimize the near-field non-radiative coupling of dipole-dipole type with the optical dipoles $\mu_1$ of the active layer 13. Conversely, it may be advantageous to make the horizontal orientation of these optical dipoles $\mu_2$ predominate when the nanoscale particles 6.1 form quantum dots, so as to optimize the intensity of the far-field photoluminescence luminous radiation. The nanoscale particles 6.1 are still located at the predetermined distance $h_{1s}$ with respect to the active layer 13.

Figure 3A:
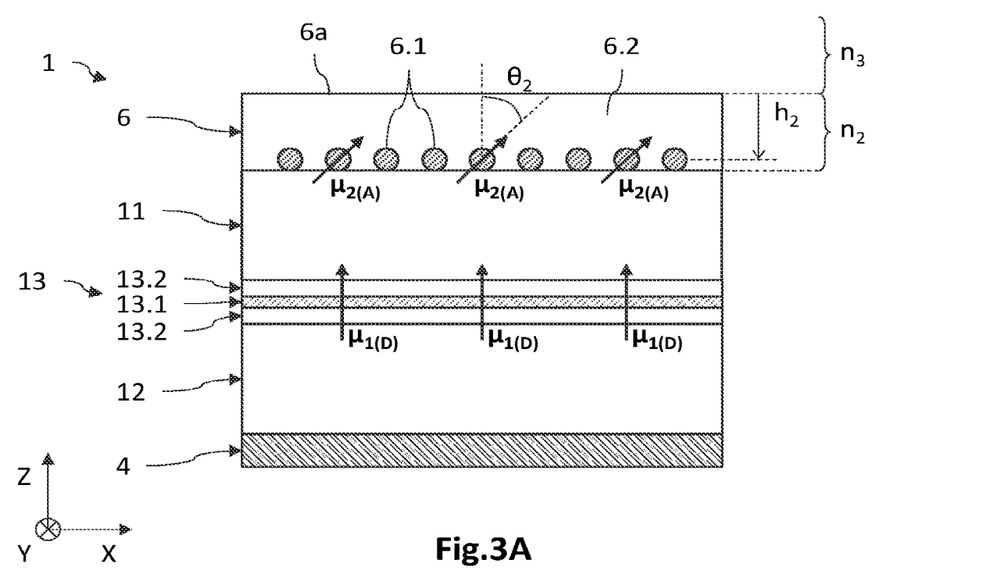
FIG. 3A is a schematic and partial cross-sectional view of the light-emitting diode already illustrated in FIG. 2A, illustrating the optical dipoles $\mu_2$ that are located in the extraction layer and are arranged at a distance h2 from the surrounding medium above the extraction layer.

FIG. 3A is a schematic and partial cross-sectional view of the light-emitting diode illustrated in FIG. 2A. The nanoscale particles 6.1 are preferably located at the interface with the first layer 11, and are arranged in a plane XY, at the distance $h_{1s}$ from the optical dipoles $\mu_1$. The dipolar dipoles $\mu_2$ form an angle $\theta_2$ with the axis Z, such that they have a vertical orientation in the case where $\theta_2=0°$, and a horizontal orientation in the case where $\theta_2=90°$. They are arranged at a distance $h_2$ with respect to the upper face 6a. It is considered here that the extraction layer 6 forms a second optically linear, uniform and isotropic medium of refractive index $n_2$, and that the surrounding medium forms a third optically linear, uniform and isotropic medium of refractive index $n_3$. The distance $h_2$ is measured from the upper face 6a along the direction −Z. Thus, a zero value $h_2$ corresponds to the upper face 6a. Dimensioning the thickness of the extraction layer 6 amounts to choosing the thickness along the axis Z of the dielectric material 6.2.

Figure 3B:
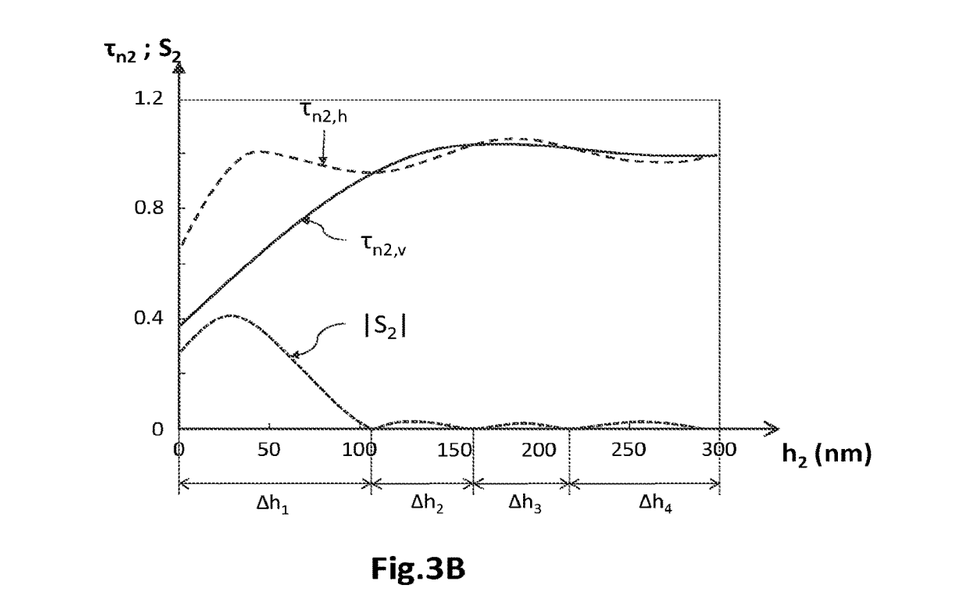
FIG. 3B illustrates an example of the change, according to the distance $h_2$, in the normalized lifetime $\tau_{n2,v}$ of an optical dipole $\mu_2$ of vertical orientation and that $\tau_{n2,h}$ of an optical dipole $\mu_2$ of horizontal orientation, in the case where the second uniform medium (extraction layer) is produced on the basis of a dielectric material, and where the third uniform medium (surrounding medium) is air, for an emission wavelength equal to 620 nm.

FIG. 3B illustrates an example of the changes, according to the distance $h_2$, in the normalized lifetime $\tau_{n2,v}$ of an emitting dipole $\mu_2$ of vertical orientation and that $\tau_{n2,h}$ of an emitting dipole $\mu_2$ of horizontal orientation, in the case where the second uniform medium is produced on the basis of a dielectric material of refractive index $n_2=1.5$, and where the third uniform medium is air, for an emission wavelength equal to 620 nm. The optical dipoles $\mu_2$ are here associated with quantum dots 6.1 emitting in the red. This figure also illustrates the change, according to the distance $h_2$, of a parameter $S_2$ called selectivity that is representative of a difference between these two normalized lifetimes $\tau_{n2,v}$, $\tau_{n2,h}$.

It is seen that the normalized lifetimes $\tau_{n2,v}$, $\tau_{n2,h}$ exhibit an increase from $h_2=0$ nm to about 50 nm for $\tau_{n2,h}$ and to about 150 nm for $\tau_{n2,v}$. Next, they remain substantially constant around 1.0 as $h_2$ increases, while exhibiting damped oscillations.

However, it is seen that the lifetime associated with one of the orientations predominates over the lifetime associated with the other orientation for a plurality of domains $\Delta h_{i=1,2}$ ... of distance $h_2$ in the range $\Delta h_{2ref}$ and that this predominance alternates according to the distance $h_2$.

Thus, it is possible to determine a distance $h_{2s}$ for which the normalized lifetime $\tau_{n2,s}$ associated with the chosen orientation (from among the vertical and horizontal orientations) of the emitting dipoles $\mu_2$ is longer than the normalized lifetime $\tau_{n,ns}$ associated with the other, non-chosen orientation. In this case, the emitting dipoles $\mu_2$ having the chosen orientation will predominate over those having the non-chosen orientation. The light-emitting diode 1 may then be dimensioned, in particular the thickness of the dielectric material 6.2 of the extraction layer 6, such that the emitting dipoles $\mu_2$ are located at the distance $h_{2s}$ from the upper face 6a, and therefore have the chosen orientation. The emitting dipoles $\mu_2$ may thus, preferably, have a horizontal orientation when the nanoscale particles 6.1 are quantum dots, or have a vertical orientation when the nanoscale particles 6.1 are metal for a plasmonic effect.

Figure 4:
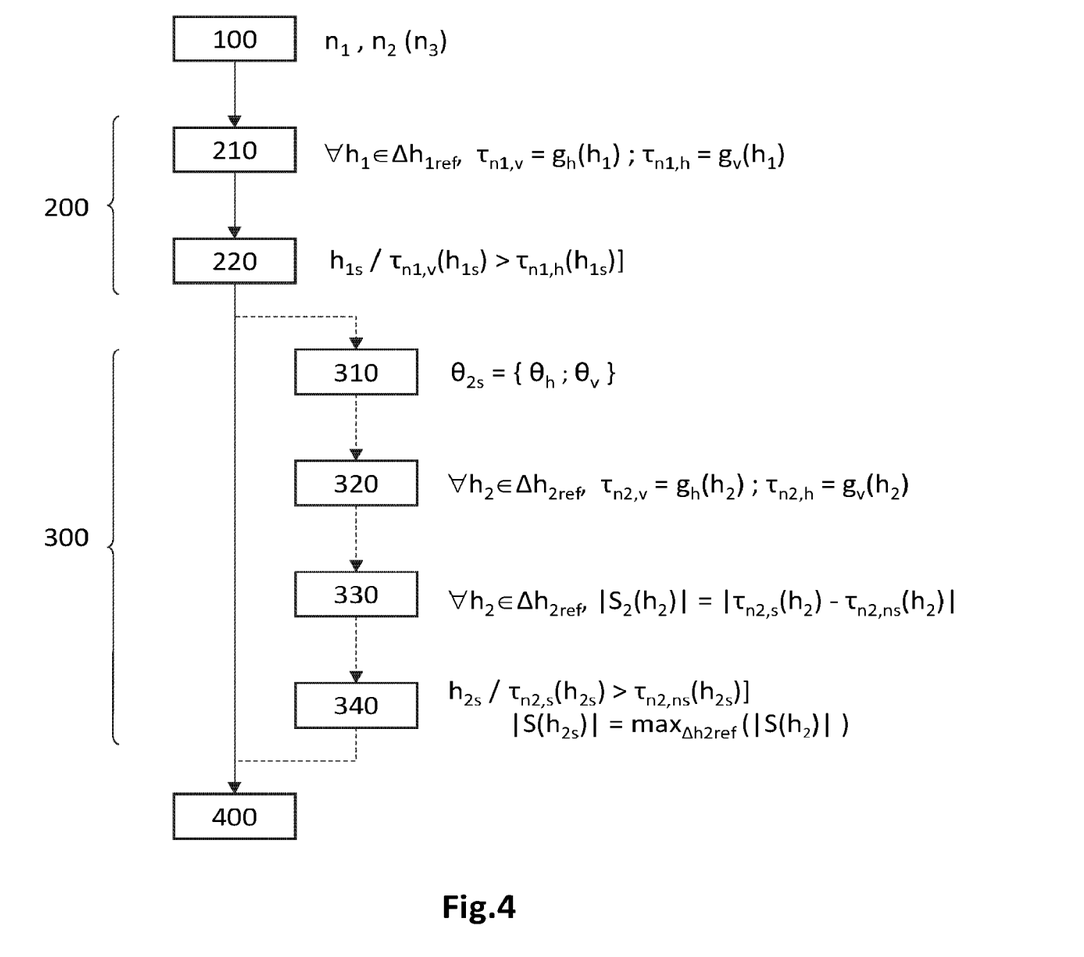
FIG. 4 illustrates a flowchart of various steps of a method for producing a light-emitting diode according to one embodiment.

FIG. 4 is a flowchart illustrating steps of a method for producing a light-emitting diode 1 according to one embodiment. The production method is here illustrated in the case of a light-emitting diode 1 comprising a semiconductor stack of inorganic type. In this example, the first layer 11 is made of N-doped GaN, and an active layer 13 is formed of a quantum well emissive layer made of InGaN. The extraction layer 6 is formed of a dielectric material 6.2 containing nanoscale particles 6.1.

In a step 100, the materials of the first layer 11 and of the active layer 13, which together form the first uniform medium of refractive index $n_1$, are chosen. Here they are N-doped GaN and InGaN, the refractive index of which is substantially equal for these two materials and corresponds to 2.4764 at the emission wavelength of 460 nm. In the case where the refractive indices are not identical, it is possible to define an average refractive index on the basis for example of a volume weighting of the refractive indices. The material of the extraction layer 6 is also chosen, which layer forms the second uniform medium of refractive index $n_2$ substantially equal to that of the dielectric material 6.2.

As mentioned above, the distance $h_1$ corresponds here to the distance along the axis Z between, on the one hand, the extraction layer 6/first layer 11 interface, and, on the other hand, halfway through the thickness of the active layer 13. In this example, the active layer 13 is a quantum well emissive layer 13.1 with a thickness of 3 nm, and it is desired to determine the thickness of the first layer 11 such that the emitting dipoles $\mu_1$ (located, to a first approximation, at the center of the active layer 13) are located at the determined distance $h_{1s}$ in order to obtain a vertical dipole orientation.

In a step 200, a value $h_{1s}$ of the distance $h_1$ is determined such that a lifetime of the emitting dipoles $\mu_1$ having the vertical orientation $\theta_v$ is longer than that of the emitting dipoles $\mu_1$ having the horizontal orientation $\theta_h$. For that, the predetermined function g expressing a relationship between a lifetime of an optical dipole having a predefined orientation $\theta$ and the distance h is used. This function g is that described above, which expresses the change in the normalized lifetime $\tau_n$ of an emitting dipole according to the distance h, by means of the normalized radiated optical power $P/P_0$.

In a sub-step 210, the change $g_h$ according to $h_1$ in the normalized lifetime $\tau_{n1,h}$ of an emitting dipole $\mu_1$ of horizontal orientation $\theta_h$ and the change $g_v$ in the normalized lifetime $\tau_{n1,v}$ of an emitting dipole $\mu_1$ of vertical orientation $\theta_v$ are determined over a distance range $\Delta h_{1ref}$ ranging for example from 0 nm to 500 nm. These changes $g_h$ and $g_v$ are determined on the basis of the relationships $\tau_n=P_0/P$ and $P/P_0=f(h)$ indicated above. Thus obtained is $\tau_{n1,v}=g_v(h_1)$ and $t_{n1,h}=g_h(h_1)$ for any $h_1$ within the range $\Delta h_{1ref}$.

In a sub-step 220, a value $h_{1s}$ is determined such that the normalized lifetime $\tau_{n1,v}$ of the emitting dipole $\mu_1$ of vertical orientation $\theta_v$ is longer than the normalized lifetime $\tau_{n1,h}$ of the emitting dipole $\mu_1$ of horizontal orientation $\theta_h$, i.e. here such that $\tau_{n1,v}(h_{1s})>\tau_{n1,h}(h_{1s})$. Additionally, the value $h_{1s}$ is advantageously determined such that the selectivity $|S_1(h_{1s})|$ is maximum over at least one domain in the range $\Delta h_{1ref}$, and preferably over the entire range $\Delta h_{1ref}$, in other words $|S_1(h_{1s})|=\max_{\Delta h_{1ref}}(|S_1(h_1)|)$.

Other conditions may also be taken into account, such as for example the fact that the value $h_{1s}$ is higher than or equal to a predefined non-zero minimum value $h_{th}$, for example in order to optimize the diffusion of the charge carriers in the plane XY within the first layer 11 from the cathode electrode 5 (illustrated in FIG. 1A).

In an optional but advantageous step 300, a value $h_{2s}$ of the distance $h_2$ is also determined such that a normalized lifetime $\tau_{n2,s}$ of the optical dipoles $\mu_2$, having a chosen orientation $\theta_{2s}$ (from among the horizontal orientation $\theta_h$ and the vertical orientation $\theta_v$), is longer than the normalized lifetime $\tau_{n2,ns}$ of the optical dipoles $\mu_2$ having the non-chosen orientation $\theta_{ns}$.

For that, in a sub-step 310, the desired orientation $\theta_{2s}$ of the optical dipoles $\mu_2$ that are associated with the nanoscale particles 6.1, i.e. here the angle $\theta_2$ formed by the dipole moment $\mu_2$ with respect to the orthogonal axis Z, is chosen from among the vertical orientation $\theta_v$ ($\theta_2=0°$) and the horizontal orientation $\theta_h$ ($\theta_{2s}=90°$). In this example, the chosen orientation $\theta_{2s}$ is the horizontal orientation $\theta_h$ ($\theta_{2s}=90°$).

In a sub-step 320, the change $g_h$ according to $h_2$ in the normalized lifetime $\tau_{n2,h}$ of an optical dipole $\mu_2$ of horizontal orientation $\theta_h$ and the change $g_v$ in the normalized lifetime $\tau_{n2,v}$ of an optical dipole $\mu_2$ of vertical orientation $\theta_v$ are determined over a distance range $\Delta h_{2ref}$ ranging for example from 0 nm to 300 nm.

In a sub-step 330, the normalized lifetime $\tau_{n2,h}$ of the optical dipole $\mu_2$ of chosen orientation is compared with the normalized lifetime $\tau_{n2,v}$ of the optical dipole $\mu_2$ of non-chosen orientation $\tau_{n,v}$ for all $h_2$ within $\Delta h_{2ref}$. The selectivity parameter $S_2$ is advantageously determined such that, for all $h_2$ within $\Delta h_{2ref}$, the absolute value $|S_2|$ of the selectivity $S_2$ is equal to the absolute value of the difference between the normalized lifetime $\tau_{n2,s}$ of the optical dipole $\mu_2$ of chosen orientation and the normalized lifetime $\tau_{n2,ns}$ of the optical dipole $\mu_2$ of non-chosen orientation, i.e. here: $|S_2(h_2)|=|\tau_{n2,s}(h_2)-\tau_{n2,ns}(h_2)|$.

In a sub-step 340, a value $h_{2s}$ is then determined such that the normalized lifetime $\tau_{n2,s}$ of the optical dipole $\mu_2$ of chosen orientation $\theta_s$ is longer than the normalized lifetime $\tau_{n2,ns}$ of the optical dipole $\mu_2$ of non-chosen orientation $\theta_{ns}$, i.e. here such that $\tau_{n2,s}(h_{2s})>\tau_{n2,ns}(h_{2s})$. Additionally, the value $h_{2s}$ is advantageously determined such that the selectivity $|S_2(h_{2s})|$ is maximum over at least one domain in the range $\Delta h_{2ref}$, and preferably over the entire range $\Delta h_{2ref}$, in other words $|S_2(h_{2s})|=\max_{\Delta h2ref}(|S_2(h_2)|)$.

In a step 400, the light-emitting diode 1 is produced such that the emitting dipoles $\mu_1$ are located at the distance $h_{1s}$ from the extraction layer 6. In the case where the active layer 13 has fixed dimensions, for example 3 nm for a quantum well layer and 12 nm for a barrier layer, the thickness of the first layer 11 is determined such that the sum of this thickness and of half of the active layer 13 is equal to the determined value $h_{1s}$, for example to within 10 nm, or even to within 5 nm.

Thus, the emitting dipoles $\mu_1$ associated with the radiative recombination of the electron-hole pairs in the active layer 13 essentially have the vertical orientation $\theta_v$. The luminous efficacy of the light-emitting diode 1 is thus improved by a near-field non-radiative coupling of dipole-dipole type between the emitting dipoles $\mu_1$ and the optical dipoles $\mu_2$.

Additionally, the thickness of the extraction layer 6, in particular the thickness of the dielectric material 6.2, the nanoscale particles 6.1 advantageously remaining at the interface with the first layer 11, is determined such that the optical dipoles $\mu_2$ are located at the distance $h_{2s}$ with respect to the interface with the air (face 6a), and thus have the chosen orientation $\theta_{2s}$. This also contributes to improving the luminous efficacy of the light-emitting diode 1.

Additionally, the production method may comprise a phase of dimensioning the second layer 12 arranged between the active layer 13 and the reflective electrode 4 (anode). Thus, it is also advantageous to dimension this layer 12 such that the emitting dipoles $\mu_1$ have the vertical orientation $\theta_{1v}$.

Figure 5A:
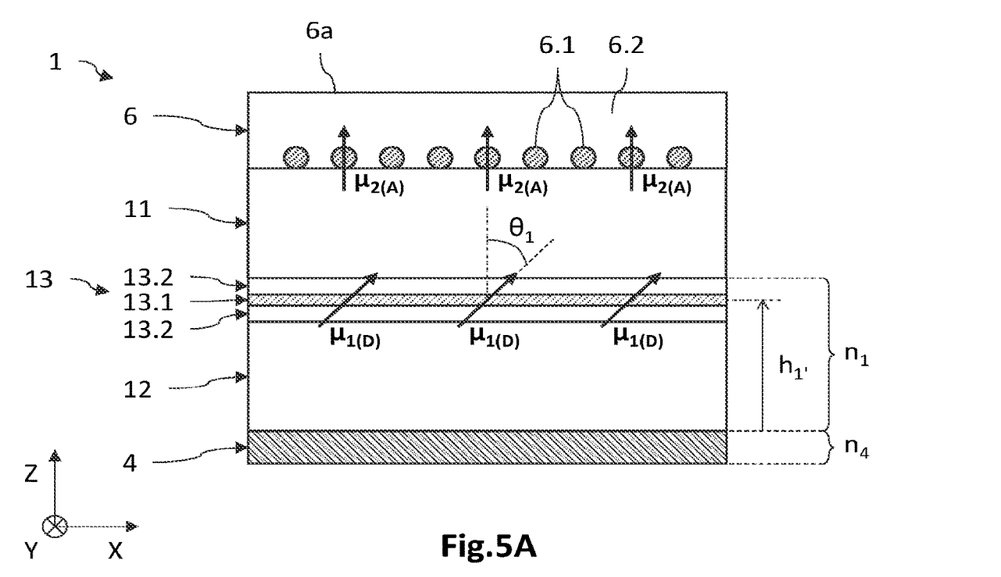
FIG. 5A is a schematic and partial cross-sectional view of the light-emitting diode already illustrated in FIG. 2A, illustrating the emitting dipoles $\mu_1$ that are located in the active layer and are arranged at a distance $h_{1'}$ from a reflective electrode (anode)

FIG. 5A is a schematic and partial cross-sectional view of the light-emitting diode illustrated in FIG. 2A. The second layer 12 and the active layer 13 form the same first uniform medium of refractive index $n_1$. The fourth optically linear, uniform and isotropic medium of optical index $n_4$ is formed by the reflective electrode 4 of refractive index $n_4$. The active layer 13, and more precisely the emitting dipoles $\mu_1$, are arranged at a distance $h_{1'}$ with respect to the reflective electrode 4. The distance $h_{1'}$ is measured from the reflective electrode 4 along the direction +Z. Thus, a zero value $h_{1'}$ corresponds to the interface between the second layer 12 and the reflective electrode 4.

Figure 5B:
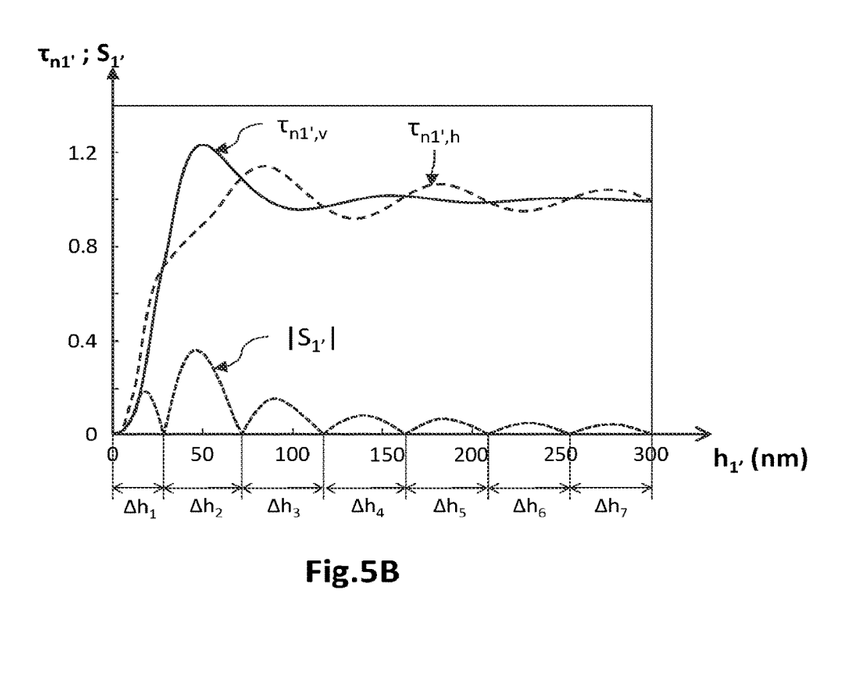
FIG. 5B illustrates an example of the change, according to the distance $h_{1'}$, in the normalized lifetime $\tau_{n1',v}$ of an emitting dipole $\mu_1$ of vertical orientation and that $\tau_{n1',h}$ of an emitting dipole $\mu_1$ of horizontal orientation, in the case where the first uniform medium (second layer and active layer) is produced on the basis of GaN, and where the fourth uniform medium (reflective electrode) is made of gold, for an emission wavelength $\lambda_e$ equal to 460 nm.

FIG. 5B illustrates an example of changes, according to the distance $h_{1'}$, in the normalized lifetime $\tau_{n1',v}$ of an emitting dipole $\mu_1$ of vertical orientation, and the normalized lifetime $\tau_{n1',h}$ of an emitting dipole $\mu_1$ of horizontal orientation. It also illustrates the change according to $h_1'$ of the selectivity $S_{1'}$.

In this example, the first uniform medium of refractive index $n_1$ is formed of the second layer 12 made of P-doped GaN and of an emissive layer made of InGaN (no barrier layer made of intrinsic GaN). The fourth uniform medium is formed by the reflective electrode 4 made here of gold, the optical index $n_4$ of which is equal to $1.3489+i\times1.8851$ at 460 nm.

The normalized lifetime $\tau_{n1'}$ of the emitting dipoles $\mu_1$ having a horizontal or vertical orientation increases from a zero value for $h_{1'}$ equal to zero to a first peak, then tends toward one and the same constant value while exhibiting damped oscillations. The constant values are substantially equal for both orientations. However, since the oscillations are not in phase with one another, there are domains $\Delta h_{i=1,2\ldots}$ in the range $\Delta h_{1ref}$ for which the normalized lifetime associated with one of the orientations predominates over the normalized lifetime associated with the other orientation. It is then possible to dimension the light-emitting diode 1, in particular to choose a value of the distance $h_{1s'}$, such that the emitting dipoles $\mu_1$ predominantly have the vertical orientation.

In this example, the emitting dipoles $\mu_1$ of vertical orientation predominate in the domains $\Delta h_2$, $\Delta h_4$, $\Delta h_6$ in the range $\Delta h_{ref}$ going from zero to 300 nm. Furthermore, the emitting dipoles $\mu_1$ of horizontal orientation predominate in the domains $\Delta h_1$, $\Delta h_3$, $\Delta h_5$, $\Delta h_7$. Thus, a distance $h_{1s'}$ in the domain $\Delta h_2$ or $\Delta h_4$, for example, will make it possible to obtain radiative recombination of the electron-hole pairs, the emitted radiation of which corresponds to that of emitting dipoles $\mu_1$ having an essentially vertical orientation.

As mentioned above, to obtain a preponderance of the emitting dipoles $\mu_1$ having the chosen orientation over those having the non-chosen orientation, it is important for the lifetime of the emitting dipoles $\mu_1$ having the chosen orientation to be longer than that of the emitting dipoles having the other orientation.

The selectivity $S_{1'}$ thus cancels out between each domain $\Delta h_i$ and has a maximum value for each of them. By way of example, the selectivity has a value of 0.18 for 18 nm in $\Delta h_1$ (horizontal orientation), a value of 0.36 for 46 nm in $\Delta h_2$ (vertical orientation), a value of 0.15 for 90 nm in $\Delta h_3$ (horizontal orientation), and a value of 0.08 for 140 nm in $\Delta h_4$ (vertical orientation). It is therefore seen that the various domains do not have a selectivity $S_{1'}$ of the same intensity, indicating that the normalized lifetimes change according to the distance $h_{1'}$ in the form of damped oscillations.

Thus, to improve the luminous efficacy of a light-emitting diode 1, it is possible to dimension it such that the emitting dipoles $\mu_1$ have a vertical orientation. For that, the distance $h_{1s'}$ is chosen in one of the domains $\Delta h_i$ in the range $\Delta h_{1ref}$ for which the lifetime of the emitting dipoles $\mu_1$ having the vertical orientation is longer than that of the emitting dipoles $\mu_1$ having the horizontal orientation. In addition, the distance $h_{1s'}$ is advantageously determined such that the selectivity $S_{1'}$ has a maximum in the determined distance range $\Delta h_{1ref}$. In this example, to obtain a predominance of the emitting dipoles $\mu_1$ of vertical orientation, it is advantageous for the distance $h_{1s'}$ to be equal to 54 nm given that the selectivity $S_1$, has a maximum equal to 0.38.

Particular embodiments have just been described. Various modifications and variants will be apparent to a person skilled in the art.

The invention claimed is:

1. A method for producing at least one light-emitting diode comprising:
   a semiconductor stack formed of a first semiconductor layer, of a second semiconductor layer, and of an active layer located between the two semiconductor layers, and
   an extraction layer, made of a transparent dielectric material comprising nanoscale particles, extending in contact with the first semiconductor layer,
   the method comprising the following steps:
   choosing the materials of the first semiconductor layer and of the active layer, and of the extraction layer;
   determining a first non-zero distance between, on the one hand, emitting dipoles associated with the radiative recombination of electron-hole pairs in the active layer and, on the other hand, the extraction layer, for which:
      a lifetime of the emitting dipoles, having a vertical orientation along an axis orthogonal to the plane of the active layer, is longer than the lifetime of the emitting dipoles having a horizontal orientation along an axis parallel to the plane of the active layer,
         on the basis of a predetermined function expressing a change in a parameter representative of the lifetime of an emitting dipole having a predefined orientation according to its distance from the extraction layer, taking into account optical properties of said materials chosen;
   optical dipoles associated with the nanoscale particles are located in the near field of the emitting dipoles, so as to allow non-radiative coupling of dipole-dipole type between the emitting dipoles and the optical dipoles;
   producing the light-emitting diode, a thickness of the first semiconductor layer being such that the emitting dipoles are located at the first determined distance with respect to the extraction layer, the emitting dipoles then being oriented orthogonally to the plane of the active layer.

2. The method as claimed in claim 1, wherein the nanoscale particles are quantum dots made of semiconductor nanocrystals, and/or are made of at least one metal material.

3. The method as claimed in claim 1, wherein the nanoscale particles have a mean diameter of between 0.2 nm and 500 nm.

4. The method as claimed in claim 1, wherein the nanoscale particles extend in a plane parallel to the active layer, and are arranged at the interface with the first semiconductor layer.

5. The method as claimed in claim 1, wherein the first determined distance is smaller than or equal to 50 nm, thus optimizing the non-radiative coupling of dipole-dipole type between the emitting dipoles and the optical dipoles.

6. The method as claimed in claim 1, wherein the first determined distance is defined along an axis orthogonal to the plane of the active layer, from an interface between the extraction layer and the first semiconductor layer to a plane passing through halfway through a thickness of the active layer.

7. The method as claimed in claim 1, wherein the active layer comprises at least one quantum well emissive layer, and a barrier layer located between the first semiconductor layer and the emissive layer, the determined distance being defined along an axis orthogonal to the plane of the active layer, between, on the one hand, the interface between the extraction layer and the first semiconductor layer, and, on the other hand, a plane passing through halfway through the thickness of the emissive layer.

8. The method as claimed in claim 1, comprising a step of determining a second non-zero distance between the optical dipoles associated with the nanoscale particles and a surrounding medium extending in contact with an upper face of the extraction layer opposite the first semiconductor layer, comprising the following sub-steps:
   choosing an orientation of the optical dipoles with respect to a plane of the extraction layer, from among:
      a horizontal orientation for which the optical dipoles are oriented so as to be parallel to the plane of the extraction layer, and
      a vertical orientation for which the optical dipoles are oriented so as to be orthogonal to the plane of the extraction layer;
   determining the second distance between the optical dipoles and the surrounding medium, for which a lifetime of the optical dipoles having the chosen orientation is longer than that of the optical dipoles having the non-chosen orientation,
      on the basis of a predetermined function expressing a change in a parameter representative of the lifetime of an optical dipole having a predefined orientation according to its distance from the surrounding medium, taking into account the optical properties of the extraction layer and of the surrounding medium;
   producing the light-emitting diode, a thickness of the dielectric material of the extraction layer being such that the optical dipoles are located at the second determined distance with respect to the surrounding medium, the optical dipoles then being oriented according to the chosen orientation with respect to the plane of the extraction layer.

9. The method as claimed in claim 8, wherein the step of determining the second distance comprises the following sub-steps:
   determining, over a predefined distance range, the change according to distance in the parameter representative of the lifetime of the optical dipole having the chosen orientation, and the change according to distance in the parameter representative of the lifetime of the optical dipole having the non-chosen orientation;
   determining a difference parameter representative of a difference in the parameter representative of the lifetime of the optical dipole having the chosen orientation with respect to the parameter representative of the lifetime of the optical dipole having the non-chosen orientation, over said predefined distance range;
   determining a non-zero distance such that:
      the parameter representative of the lifetime of the optical dipole having the chosen orientation is greater, for the determined distance, than the parameter representative of the lifetime of the optical dipole having the non-chosen orientation, and that
      the difference parameter has, for the determined distance, a maximum value over at least a portion of the distance range.

10. The method as claimed in claim 1, comprising:
   a step of determining a third non-zero distance between the emitting dipoles and a reflective electrode extending in contact with the second semiconductor layer, for which a lifetime of the emitting dipoles having the vertical orientation is longer than that of the emitting dipoles having the horizontal orientation, on the basis of a predetermined function expressing a change in a parameter representative of the lifetime of an emitting dipole having a predefined orientation according to its distance from the reflective electrode, taking into account the optical properties of the active layer and of the second semiconductor layer, and of the reflective electrode;

producing the light-emitting diode, a thickness of the second semiconductor layer being such that the emitting dipoles are located at the third determined distance with respect to the reflective electrode, the emitting dipoles then being oriented orthogonally to the plane of the active layer.

11. The method as claimed in claim 10, wherein the reflective electrode is an anode capable of injecting holes into the semiconductor stack, and the second semiconductor layer is made of a P-doped semiconductor crystalline material, or is made of a hole- conducting organic semiconductor material.

12. The method as claimed in claim 1, wherein the first semiconductor layer is made of an N-doped semiconductor crystalline material, or is made of an electron-conducting organic semiconductor material.

\* \* \* \* \*